US012635479B2

(12) United States Patent (10) Patent No.: US 12,635,479 B2
Hino et al. (45) Date of Patent: May 19, 2026

---

(54) SUBSTRATE HOLDER

(71) Applicant: NGK SPARK PLUG CO., LTD.,
Nagoya (JP)

(72) Inventors: Makoto Hino, Nagoya (JP); Tetsuo Kitabayashi, Nagoya (JP); Hiromasa Shimojima, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 316 days.

(21) Appl. No.: 18/191,377

(22) Filed: Mar. 28, 2023

(65) Prior Publication Data

US 2023/0317506 A1 Oct. 5, 2023

(30) Foreign Application Priority Data

Mar. 29, 2022 (JP) ................................. 2022-053674

(51) Int. Cl.
*H01J 37/32* (2006.01)
*C23C 14/50* (2006.01)
(Continued)

(52) U.S. Cl.
CPC .......... *H10P 72/7624* (2026.01); *C23C 14/50* (2013.01); *C23C 16/458* (2013.01); (Continued)

(58) Field of Classification Search
CPC ......... H01L 21/68785; H01L 21/67103; H01L 21/6833; H01L 21/68792; H01L 21/6875; (Continued)

(56) References Cited

U.S. PATENT DOCUMENTS 5,688,331 A 11/1997 Aruga et al.
6,494,955 B1 12/2002 Lei et al.
(Continued)

FOREIGN PATENT DOCUMENTS

EP 1 089 593 A2 4/2001
JP H07-153706 A 6/1995
(Continued)

OTHER PUBLICATIONS

Japan Patent Office, Office Action (Notice of Reasons for Refusal) issued in corresponding Application No. JP 2022-053674, dated Feb. 18, 2025.
(Continued)

*Primary Examiner* — Rodney G McDonald
(74) *Attorney, Agent, or Firm* — Stites & Harbison, PLLC; Jeffrey A. Haeberlin

(57) ABSTRACT

There is provided a substrate holder including: a ceramic base member, an electrode and a shaft. The ceramic base member is provided with: an annular projected part and a plurality of projected parts. A circular area of which diameter is not less than 0.4 times an inner diameter of the cylindrical part is provided on a center in an upper surface of the ceramic base member. A first envelope surface of projected parts arranged in the circular area is a flat surface, and a second envelope surface of projected parts arranged at outside of the circular area is a curved surface. Alternatively, the first envelope surface is a curved surface having a first curvature and the second envelope surface is a flat surface or a curved surface having a second curvature which is different from the first curvature.

7 Claims, 10 Drawing Sheets

(51) Int. Cl.

| | | |
|---|---|---|
| *C23C 16/458* | (2006.01) |
| *H10P 72/00* | (2026.01) |
| *H10P 72/72* | (2026.01) |
| *H10P 72/76* | (2026.01) |

(52) U.S. Cl.
CPC ...... *C23C 16/4581* (2013.01); *C23C 16/4582* (2013.01); *C23C 16/4586* (2013.01); *H01J 37/32715* (2013.01); *H10P 72/0432* (2026.01); *H10P 72/722* (2026.01); *H10P 72/7626* (2026.01)

(58) Field of Classification Search
CPC ... C23C 14/50; C23C 16/458; C23C 16/4581; C23C 16/4582; C23C 16/4586; H01J 37/32715
USPC ........................................................ 118/728
See application file for complete search history.

(56) References Cited

U.S. PATENT DOCUMENTS

| | | | |
|---|---|---|---|
| 2003/0089600 | A1 | 5/2003 | Natsuhara et al. |
| 2003/0094447 | A1 | 5/2003 | Yamaguchi |
| 2005/0082274 | A1 | 4/2005 | Kondou et al. |
| 2007/0151517 | A1 | 7/2007 | Baik et al. |
| 2009/0235866 | A1 | 9/2009 | Kataigi et al. |
| 2011/0005686 | A1 | 1/2011 | Tanaka et al. |
| 2013/0126206 | A1 | 5/2013 | Zhou et al. |
| 2013/0284374 | A1 | 10/2013 | Lubomirsky et al. |
| 2014/0087587 | A1 | 3/2014 | Lind |
| 2016/0002778 | A1 | 1/2016 | Ravi et al. |
| 2016/0225651 | A1 | 8/2016 | Tran et al. |
| 2016/0230281 | A1 | 8/2016 | Lin et al. |
| 2018/0337081 | A1 | 11/2018 | Ye |
| 2020/0135530 | A1* | 4/2020 | Shah ...................... H05B 3/283 |
| 2022/0084870 | A1* | 3/2022 | Mitsuishi ............... H01L 21/02 |

FOREIGN PATENT DOCUMENTS

| | | | |
|---|---|---|---|
| JP | 2001-102157 | A | 4/2001 |
| JP | 2002-93894 | A | 3/2002 |
| JP | 2003-151729 | A | 5/2003 |
| JP | 2003-160874 | A | 6/2003 |
| JP | 2005-018992 | A | 1/2005 |
| JP | 2005-109169 | A | 4/2005 |
| JP | 2008-243990 | A | 10/2008 |
| JP | 2010-109316 | A | 5/2010 |
| JP | 2016-139649 | A | 8/2016 |
| JP | 2016-178284 | A | 10/2016 |
| KR | 10-2007-0072233 | A | 7/2007 |
| KR | 10-2009-0101093 | A | 9/2009 |
| KR | 10-1333631 | B1 | 11/2013 |
| KR | 10-2014-0097312 | A | 8/2014 |
| KR | 10-2015-0013522 | A | 2/2015 |
| KR | 10-2017-0029550 | A | 3/2017 |
| KR | 10-2017-0108152 | A | 9/2017 |
| KR | 10-2021-0144892 | A | 11/2021 |
| WO | 2020/226152 | A1 | 11/2020 |

OTHER PUBLICATIONS

Japan Patent Office, Office Action (Notice of Reasons for Refusal) issued in corresponding Application No. 2022-053674, dispatched Jul. 15, 2025.

Japan Patent Office, Office Action (Notice of Reasons for Refusal) issued in corresponding Application No. 2022-053674, mailed Dec. 16, 2025.

Korean Intellectual Property Office, Office Action issued in corresponding Application No. 10-2023-0024436 mailed Feb. 18, 2026.

\* cited by examiner

SUBSTRATE HOLDER

REFERENCE TO RELATED APPLICATIONS

This application claims priority from Japanese Patent Application No. 2022-053674 filed on Mar. 29, 2022. The entire content of the priority application is incorporated herein by reference.

BACKGROUND ART

Technical Field

The present disclosure relates to a substrate holder which is configured to hold a substrate such as a silicon wafer, etc.

Background Art

Conventionally, there is a publicly known substrate holder which is provided with a shaft and which holds a substrate such as a wafer, etc. A certain publicly known substrate holder has: a ceramic base member (base body) which is plate-shaped and in which a heating resistor (heater electrode) is embedded; and a tubular member (shaft) joined to a central part in a lower surface of the ceramic base body and provided with a feeding rod which is disposed in the inside of the tubular member and which is connected to the heating resistor. An upper surface (heating surface) of the ceramic base body serves as a placement surface in which the substrate is placed. The placement surface of the ceramic base body has a monotonic convex surface in which a central part thereof is the highest and which becomes lower further toward a peripheral part thereof.

DESCRIPTION

Problem to be Solved by the Invention

In the publicly known substrate holder as described above, the placement surface has the monotonic convex shape. The substrate is held on the placement surface by attracting the substrate to the placement surface by suction. In such a situation, the substrate is attracted while being inclined, in some cases. Due to this, there is such a fear that any local gap might be defined between the substrate and the placement surface, particularly at an outer peripheral part of the substrate, which might lead to such a fear that the adhesion property between the substrate and the placement surface might become nonuniform.

The present disclosure has been made in view of the above-described circumstances; an object of the present disclosure is to provide a substrate holder which is capable of suppressing the nonuniformity in the adhesion property between the substrate and the placement surface.

According to an aspect of the present disclosure, there is provided a substrate holder including: a ceramic base member including an upper surface and a lower surface which faces the upper surface in an up-down direction; an electrode embedded in the ceramic base member or arranged in the lower surface of the ceramic base member; and a shaft having a cylindrical part which has a cylindrical shape and which is joined to the lower surface of the ceramic base member. The ceramic base member includes: an annular projected part which is arranged in an outer peripheral part of the upper surface of the ceramic base member and which projects upward to be higher than the upper surface of the ceramic base member; and a plurality of projected parts which is arranged on an inner side, with respect to the annular projected part, of the upper surface of the ceramic base member, and which projects upward to be higher than the upper surface of the ceramic base member. A circular area which is coaxial with the ceramic base member and of which diameter is not less than 0.4 times an inner diameter of the cylindrical part is provided on a center in the upper surface of the ceramic base member. A first envelope surface which is an envelope surface of upper surfaces of projected parts, of the plurality of projected parts, arranged in the circular area is a flat surface, and a second envelope surface which is an envelope surface of upper surfaces of projected parts, of the plurality of projected parts, arranged at outside of the circular area is a curved surface. Alternatively, the first envelope surface is a curved surface having a first curvature and the second envelope surface is a flat surface or a curved surface having a second curvature which is different from the first curvature.

In the above-described aspect, since the annular projected part is provided on the outer peripheral part of the upper surface of the ceramic base member, it is possible to suppress any deformation of the outer edge part (outer peripheral part) of the base member in a case that the substrate is attracted toward the upper surface of the ceramic base member by suction. Further, the first envelope surface is the flat surface and the second envelope surface is the curved surface. Alternatively, the first envelope surface is the curved surface having the first curvature and the second envelope surface is the flat surface or the curved surface having the second curvature which is different from the first curvature. Accordingly, in the case that the substrate is attracted toward the upper surface of the ceramic base member by suction, it is possible to statically determinate the entire surface of the substrate quickly. Further, occurrence of such a situation that the substrate is attracted to the substrate holder by suction in a state that the substrate is inclined is suppressed. This makes it possible to suppress any generation of a gap locally between the substrate and the annular projected part. With this, it is possible to suppress any generation of a heat spot in the substrate, and to suppress any nonuniformity in temperature distribution of the substrate.

BRIEF DESCRIPTION OF THE DRAWINGS

FIG. 1 is a view schematically explaining a substrate holder 100.

FIG. 4 is a view depicting a schematic outer appearance of a substrate holder 100 having a shaft 130.

FIRST EMBODIMENT

\<Substrate Holder 100\>

Figure 1:
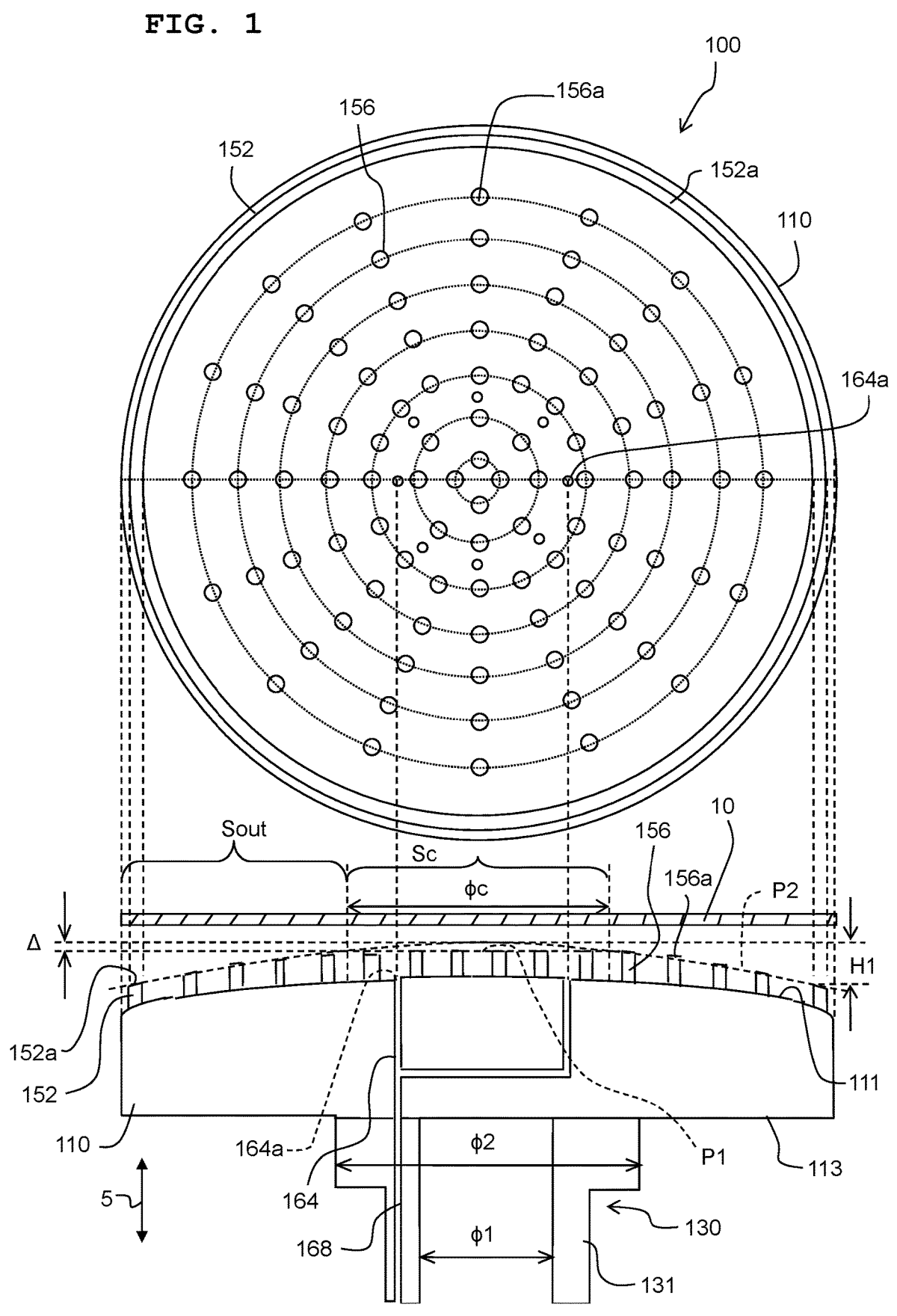
Figure 2:
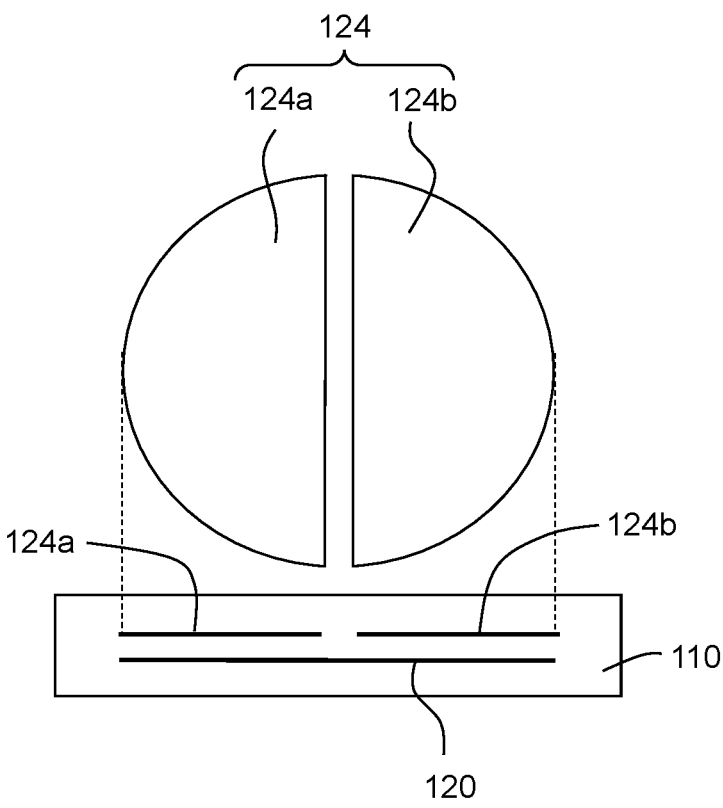
FIG. 2 is a view schematically explaining an electrode for electrostatic (attraction) 124 (electrostatic attraction electrode 124).

A substrate holder 100 according to a first embodiment of the present disclosure will be explained, with reference to FIG. 1. The substrate holder 100 according to the present embodiment is a ceramic heater used for heating a semiconductor wafer (herein after referred simply as to a "wafer 10") such as a silicon wafer, etc. Note that in the following explanation, an up-down direction 5 is defined, with a state that the substrate holder 100 is installed usably (a state depicted in FIG. 1) as the reference. As depicted in FIG. 1, the substrate holder 100 according to the present embodiment is provided with a ceramic base member 110, an electrode 120 (see FIGS. 2 and 3), an electrostatic attraction electrode 124 (see FIG. 2), a shaft 130 and a feeding line 140 (see FIG. 4).

Figure 4:
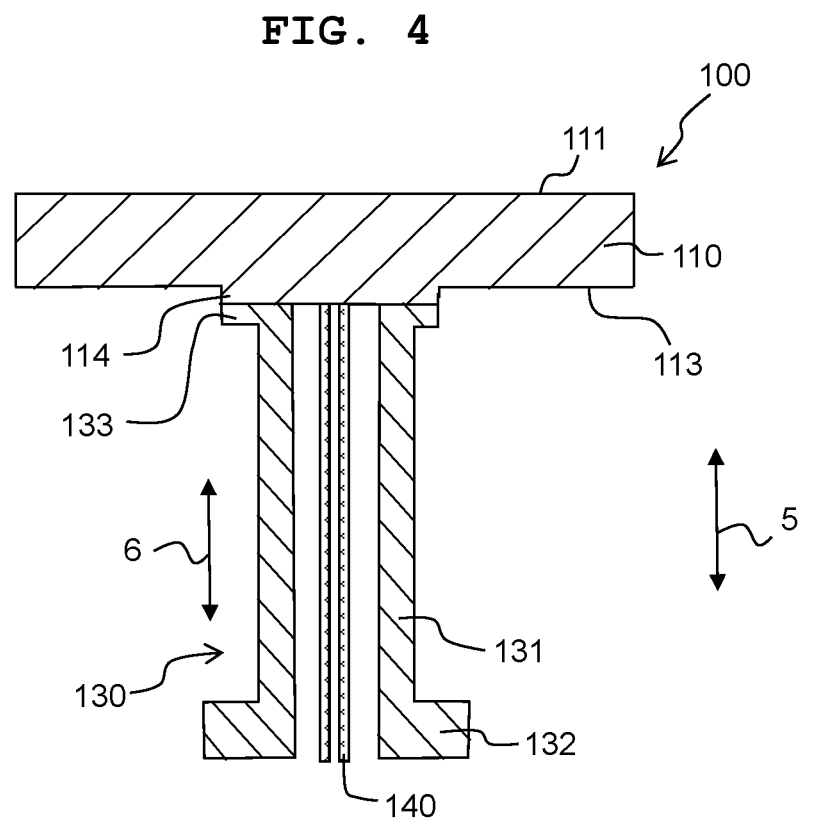

The ceramic base member 110 is a member having a shape of a circular plate of which diameter is 12 inches (approximately 300 mm); a wafer 10 as an object of heating is placed on the ceramic base member 110. As depicted in FIG. 1, it is also possible to make a lower surface 113 of the ceramic base member 110 to be a flat surface. Alternatively, as depicted in FIG. 4, it is possible to provide, on the lower surface 113 of the ceramic base member 100, a projected part 114 for the joining with respect to the shaft 130 (hereinafter referred to as a "joining projected part 114"). Further, as depicted in FIG. 1, an upper surface 111 of the ceramic base member 110 has a convex curved shape of which center is bulged as compared with an outer peripheral part thereof (note, however, that in FIGS. 2 and 4, the upper surface 111 of the ceramic base member 110 is depicted as a flat surface, for simplifying the drawings). For example, in the present embodiment, a central part of the upper surface 111 of the ceramic base member 110 is made to be higher by 20 as compared with an outer peripheral part (outer edge part) of the upper surface 111. A projected part 152 having an annular (circular) shape (hereinafter referred to simply as an "annular projected part 152") and a plurality of projected parts 156 are provided on the upper surface 111 of the ceramic base member 110. A first gas channel 164 (to be described later on) is formed in the inside of the ceramic base member 110. The ceramic base member 110 can be formed, for example, of a ceramic sintered body of aluminum nitride, silicon carbide, alumina, silicon nitride, etc.

As depicted in FIG. 1, the annular projected part 152 is a projected part having a substantially annular (circular ring) shape and arranged at the outer peripheral part of the upper surface 111 of the ceramic base member 110, and projects upward to be higher than the upper surface 111. In a case that the wafer 10 is placed on the ceramic base member 110, an upper surface 152a of the annular projected part 152 makes contact with a lower surface of the water 10. Namely, the annular projected part 152 is arranged at a position at which the annular projected part 152 overlaps with the wafer 10 in the up-down direction 5 in the case that the wafer 10 is placed on the ceramic base member 110.

Figure 7:
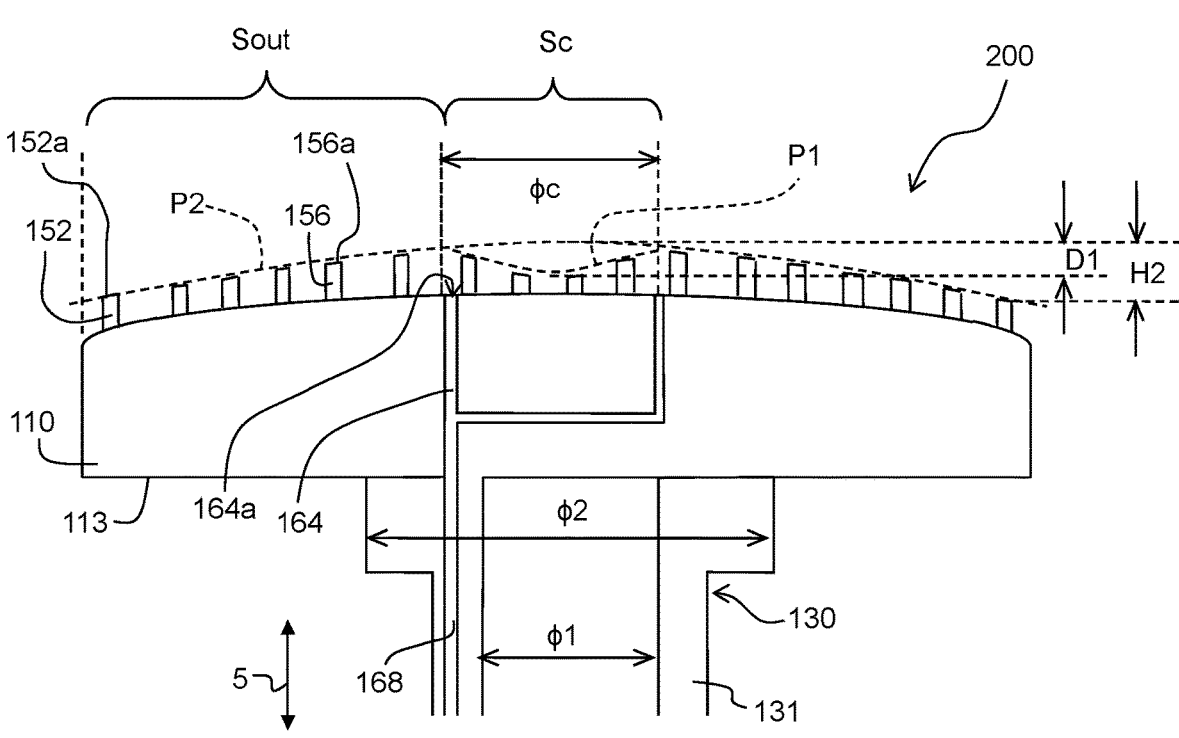
FIG. 7 is a view schematically explaining a substrate holder 200.

The plurality of projects parts 156 arranged coaxially (in concentric circles) is provided on the upper surface 111 of the ceramic base member 110, at a location on the inside of the annular projected part 152. Each of the plurality of projected parts 156 has a cylindrical shape. In the present embodiment, in a circular area Sc positioned at the center of the ceramic base member 110, upper surfaces of projected parts 156, of the plurality of projected parts 156, are processed so that an envelope surface P1 of upper surfaces 156a of the projected parts 156 becomes to be a horizontal flat surface (in the present embodiment, a flat surface parallel to the lower surface 113 of the ceramic base member 110). Note that the term "envelope surface" is a surface in which difference in height with respect to the plurality of projected parts 156 is not more than 2 μm; in the present embodiment, the envelope surface P2 defined in such a manner becomes to be a horizontal flat surface. The envelope surface P1 is an example of a "first envelope surface" of the present disclosure. In the present embodiment, in an outer area Sout positioned at the outside of the circular area Sc, upper surfaces of projected parts 156, of the plurality of projected parts 156, are processed so that an envelope surface P2 of upper surfaces 156a of the projected parts 156 becomes to be a convex surface bulged toward the center of the ceramic base member 110 (a convex curved surface). The envelope surface P2 is an example of a "second envelope surface" of the present disclosure. In the present embodiment, a height H2 of the envelope surface P2 is 20 μm. Note that as depicted in FIG. 7, the height H2 of the envelope surface P2 is defined as a difference between the highest position and the lowest position in the envelope surface P2. The highest position in the envelope surface P2 can be obtained by approximating a cross section of the envelope surface passing the center by the arc or the curve of the second order. In the present embodiment, a difference Δ in height (height difference Δ) between the envelope surface P1 and the envelope surface P2 is 5 μm. Note that the height difference Δ between the envelope surface P1 and the envelope surface P2 is designed to be within a range of 5 μm to 1011m.

As depicted in FIG. 1, a diameter φc of the circular area Sc is greater than an inner diameter φ1 of a cylindrical part 131 of the shaft 130, and is smaller than a maximum outer diameter φ2 of the cylindrical part 131 of the shaft 130 (φ1<φc<φ2). In the present embodiment, the diameter φc of the circular area Sc is 20 mm, the inner diameter φ1 of the cylindrical part 131 of the shaft 130 is 45 mm and the maximum outer diameter φ2 of the cylindrical part 131 of the shaft 130 is 65 mm. Note, however, that the diameter φc of the circular area Sc, the inner diameter φ1 and the maximum outer diameter φ2 of the cylindrical part 131 are not limited, respectively, to these values. It is possible to make the diameter φc of the circular area Sc to be not less than 0.4 times the inner diameter φ1 of the cylindrical part 131 of the shaft 130. Further, it is possible to make the diameter φc of the circular area Sc to be not more than 1.5 times the maximum outer diameter φ2 of the cylindrical part 131 of the shaft 130.

It is possible to make a height (a length in the up-down direction 5 from the upper surface 111) of the annular projected part 152 to be within a range of 5 μm to 2 mm. Similarly, it is also possible to make a height of the plurality of projected parts 156 to be within a range of 5 μm to 2 mm.

It is desired that the annular projected part 152 has a constant width, and can be made to have a width in a range of 0.1 mm to 10 mm. A surface roughness Ra of the upper surface 152a of the annular projected part 152 can be made to be not more than 1.6 μm. The surface roughness Ra of the upper surfaces 156a of the plurality of projected parts 156 can be made to be not more than 1.6 μm. Note that the surface roughness Ra of each of the upper surface 152a of the annular projected part 152 and the upper surfaces 156a of the plurality of projected part 156 is preferably not more than 0.4 μm, more preferably not more than 0.2 μm, and further more preferably not more than 0.1 μm. For example, in the present embodiment, the width of the annular projected part 152 is 3 mm, and the surface roughness Ra of each of the upper surface 152a of the annular projected part 152 and the upper surfaces 156a of the plurality of projected part 156 is 0.4 μm.

The upper surfaces 156a of the plurality of projected parts 156 are preferably circular-shaped of which diameter is in a range of 0.1 mm to 5 mm. Further, the clearance (spacing distance) between the respective projected parts 156 in the plurality of projected parts 156 can be made within a range of 1.5 mm to 30 mm. For example, in the present embodiment, the upper surfaces 156a of the plurality of projected parts 156 are circular-shaped of which diameter is 2 mm, and the clearance between the respective projected parts 156 in the plurality of projected parts 156 arranged, respectively, in concentric circles is set to be within a range of 10 mm to 15 mm.

As depicted in FIG. 1, the first gas channel 164 is formed in the inside of the ceramic base member 110. Eight openings 164a of the first gas channel 164 are opened in the circular area Sc of the upper surface 111. In the circular area Sc, the eight openings 164a are arranged in a circular form at equal intervals (at intervals of 45 degrees) therebetween. The first gas channel 164 extends downward from each of the eight openings 164a and then extends in a horizontal direction to be joined, and extends further downward. A lower end of the first gas channel 164 is joined to an upper end of a second gas channel 168 formed in the inside of the shaft 130.

The first gas channel 164 can be used as a channel for supplying a gas to a space (gap) defined by the upper surface 111 of the ceramic base member 110 and the lower surface of the wafer 10. For example, it is possible, via the first gas channel 164, to supply a heat transfer gas for heat transfer between the wafer 10 and the ceramic base member 110. As the heat transfer gas, for example, it is possible to use an inert gas such as helium, argon, etc., a nitrogen gas, etc. The heat transfer gas is supplied via the first gas channel 164 at a pressure which is set within a range of 100 Pa to 40000 Pa. Further, in a case that a process gas enters into a gap in the inside of the annular projected part 152, from a gap between the upper surface 152a of the annular projected part 152 and the lower surface of the wafer 10, it is possible to exhaust (discharge) the process gas via the first gas channel 164. In this situation, by adjusting the exhaust pressure, it is possible to adjust a differential pressure between the pressure at the outside of the gap and the pressure at the inside of the gap. With this, it is possible to attract the wafer 10, by suction, toward the upper surface of the ceramic base member 110.

Figure 3:
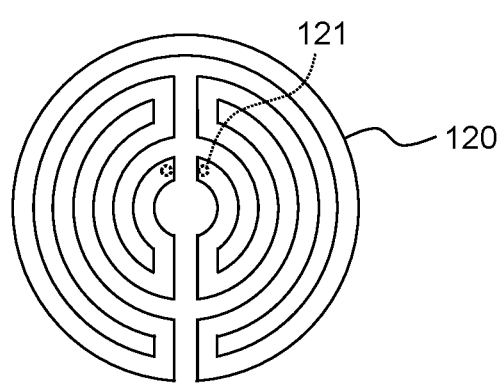
FIG. 3 is a view schematically explaining an electrode 120.

As depicted in FIG. 2, the electrostatic attraction electrode 124 and the electrode 120 (an example of a "heating element" of the present disclosure) are embedded in the inside of the ceramic base member 110. As depicted in FIG. 2, the electrostatic attraction electrode 124 is arranged such that two semi-circular electrodes 124a and 124b face each other at a predetermined spacing distance (5 mm), and has, as a whole, a substantially circular shape. The outer diameter of the electrostatic attraction electrode 124 is 294 mm. As depicted in FIG. 3, the electrode 120 is a metallic mesh or foil which is cut into a shape of a belt or band. The outer diameter of the electrode 120 is 298 mm. The electrode 120 does not expose from a side surface of the ceramic base member 110. A terminal part 121 which is connected to the feeding line 140 (see FIG. 4) is provided at a substantially central part of the electrode 120. The electrode 120 is formed of a heat resisting metal (high melting point metal) such as, for example, a foil including tungsten (W), molybdenum (Mo) or an alloy including the molybdenum and/or the tungsten; or a mesh which is obtained by weaving a wire including tungsten (W), molybdenum (Mo) or an alloy including the molybdenum and/or the tungsten; etc. It is preferred that the purity of each of the tungsten and the molybdenum is not less than 99%. The thickness of the electrode 120 is not more than 0.15 mm. Note that from a viewpoint of making the resistance value of the electrode 120 to be high to thereby reduce the current consumption of the electrode 120, it is preferred that the wire diameter of the wire is made to be not more than 0.1 mm and that the thickness of the electrode 120 is made to be not more than 0.1 mm. Further, the width of the electrode 120 which is cut into the shape of the band is preferably in a range of 2.5 mm to 20 mm, more preferably in a range of 5 mm to 15 mm. In the present embodiment, although the electrode 120 is cut in the shape as depicted in FIG. 3, the shape of the electrode 120 is not limited to this, and may be changed as appropriate. Note that in the configuration of the present disclosure it is not necessarily indispensable that both of the electrostatic attraction electrode 124 and the electrode 120 are embedded in the inside of the ceramic base member 110. For example, it is allowable that only either one of the electrostatic attraction electrode 124 and the electrode 120 is embedded in the inside of the ceramic base member 110. Alternatively, it is allowable that a plasma electrode configured to generate a plasma at a location above the ceramic base member 110 is embedded in the inside of the ceramic base member 110, in addition to at least one of the electrostatic attraction electrode 124 and the electrode 120. Still alternatively, it is allowable that the plasma electrode is embedded in the inside of the ceramic base member 110, rather than the electrostatic attraction electrode 124 and the electrode 120.

As depicted in FIGS. 1 and 4, the shaft 130 is connected to the lower surface 113 of the ceramic base member 110. As described above, it is also allowable that the lower surface 113 of the ceramic base member 110 is a flat surface (see FIG. 1), and/or that the projected part 114 for the joining with respect to the shaft 130 (hereinafter referred to as the "joining projected part 114") (see FIG. 4) is provided on the lower surface 113 of the ceramic base member 110 (see FIG. 4). As depicted in FIG. 1, the shaft 130 has the cylindrical part 131 which has a substantially hollow cylindrical shape. A flange part 133 having the maximum outer diameter φ2 in the cylindrical part 131 is provided on an upper end of the cylindrical part 131 (see FIG. 4). Note that as depicted in FIG. 4, it is allowable that the shaft 130 has a large diameter part 132 provided at a location below the cylindrical part 131. The large diameter part 132 has a diameter which is greater than the diameter of the cylindrical part 131. In the following explanation, the longitudinal direction of the cylindrical part 131 is defined as a longitudinal direction 6 of the shaft 130. As depicted in FIGS. 1 and 4, in a usage state of the substrate holder 100, the longitudinal direction 6 of the shaft 130 is parallel to the up-down direction 5.

Note that in a case that the joining projected part 114 is formed in the lower surface 113 of the ceramic base member 110, it is preferred that the shape of the joining projected part 114 is same as the shape of an upper surface of the cylindrical part 131 of the shaft 130 to which the joining projected part 114 is (to be) joined and that the diameter of the joining projected part 114 is not more than 100 mm. It is allowable that the height (a height from the lower surface 113) of the joining projected part 114 is not less than 0.2 mm, and is preferably not less than 2 mm. Although there is no particular limitation to the upper limit value of the height of the joining projected part 114, in view of the easiness of the production, it is preferred that the height of the joining projected part 114 is not more than 20 mm. Further, it is preferred that the lower surface of the joining projected part 114 is parallel to the lower surface 113 of the ceramic base member 113. It is allowable that the surface roughness Ra of the joining projected part 114 is not more than 1.6 μm. Note that the surface roughness Ra of the lower surface of the joining projected part 114 is preferably not more than 0.4 μm, and more preferably not more than 0.2 μm.

The upper surface of the cylindrical part 131 is fixed to the lower surface 113 of the ceramic base member 110 (in a case that the joining projected part 114 is provided, the upper surface of the cylindrical part 131 is fixed to the lower surface of the joining projected part 114). Note that similarly to the ceramic base member 110, the shaft 130 may be formed of a ceramic sintered body such as aluminum nitride, silicon carbide, alumina, silicon nitride, etc. Alternatively, in order to enhance the heat insulating property, the shaft 130 may be formed of a material of which thermal conductivity is lower than that of the ceramic base member 110.

As depicted in FIGS. 1 and 4, the shaft 130 has a hollow cylindrical shape, and a through hole extending in the longitudinal direction 6 is formed in the inside of the shaft 130 (an area in the inside with respect to the inner diameter). The feeding line 140 (see FIG. 4) which is configured to supply the electric power to the electrode 120 is arranged in a hollow part (through hole) of the shaft 130. An upper end of the feeding line 140 is electrically connected to the terminal part 121 (see FIG. 3) arranged in the center of the electrode 120. The feeding line 140 is connected to a non-illustrated power source for heater. With this, the electric power is supplied to the electrode 120 via the feeding line 140.

Further, as depicted in FIG. 1, the gas channel 168 which extends in the up-down direction 5 is formed in the cylindrical part 131 of the shaft 130. As described above, the upper end of the gas channel 168 is connected to the lower end of the first gas channel 164. Note that it is not necessarily indispensable that the gas channel 168 is formed in the cylindrical part 131 of the shaft 130; it is also allowable to provide a gas piping separately, on an area inside with respect to the inner diameter of the cylindrical part 131.

Next, an explanation will be given about a method of producing the substrate holder 100. In the following, a case that the ceramic base member 110 and the shaft 130 are formed of aluminum nitride will be explained, as an example.

Figure 5A:
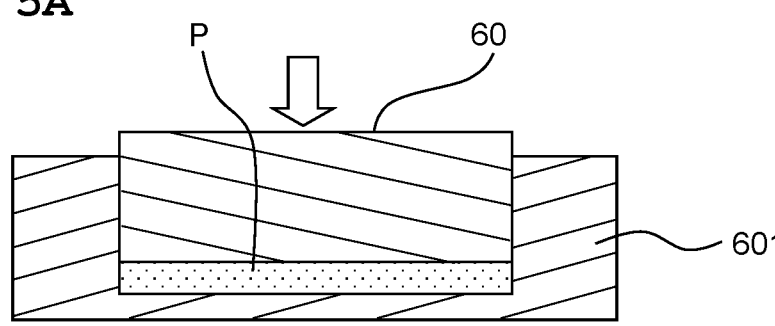
FIGS. 5A to 5E are views depicting a flow of a method of producing a ceramic base member 110.
Figure 5B:
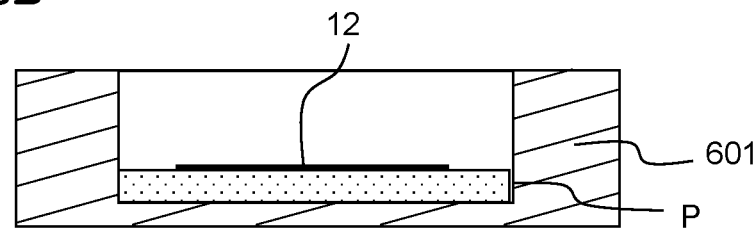

First, a method of producing the ceramic base member 110 will be explained. As depicted in FIG. 5A, granulated powder P which contains aluminum nitride (AlN) powder as a main component thereof is charged to a bottomed mold 601 made of carbon, and is subjected to a temporary pressing with a punch 602. Note that it is preferred that a not more than 5 wt % of sintering agent (for example, $Y_2O_3$) is included in the granulated powder P. Next, as depicted in FIG. 5B, the electrode 120 which is cut to a predetermined shape is arranged on the temporarily pressed granulated powder P. Note that the electrode 120 is arranged to be parallel to a plane orthogonal to a pressing direction (the bottom surface of the bottomed mold 601). In this situation, it is allowable to embed a pellet formed of tungsten (W) or molybdenum (Mo) at a position of the terminal 121 of the electrode 120 (see FIG. 3).

Figure 5C:
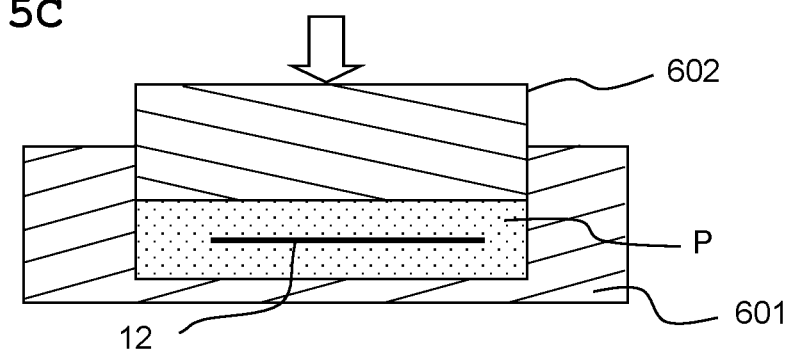
Figure 5D:
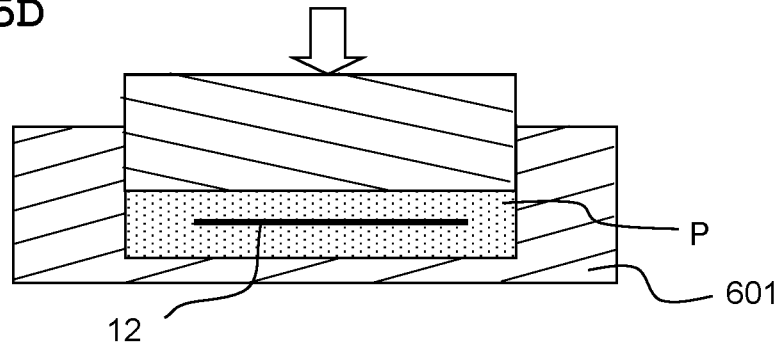
Figure 5E:
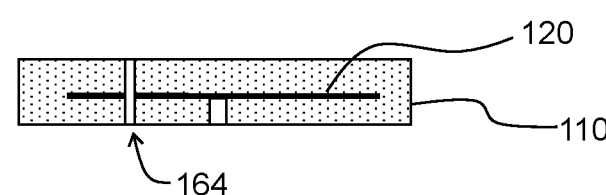

As depicted in FIG. 5C, the granulated power P is further charged to the bottomed mold 601 so as to cover the electrode 120, and is subjected to molding while being pressed with the punch 602. Next, as depicted in FIG. 5D, the baking is performed for the granulated power P in which the electrode 120 is embedded in a state that the granulated power P is pressed. The pressure applied during the baking is preferably not less than 1 MPa. Further, it is preferred that the baking is performed at a temperature which is not less than 1800° C. Next, as depicted in FIG. 5E, the blind hole driving processing is performed up to a location of the electrode 120 so as to form the terminal 121. Note that in a case that the pellet is embedded, it is allowable to perform the blind hole driving processing up to a location of the pellet. Further, a through hole which becomes to be a part of the first gas channel 164 is formed. With this, it is possible to produce a ceramic base member 110 in which the first gas channel 164 is formed in the inside thereof. In this case, a predetermined clearance is provided so that the electrode 120 is not exposed from the first gas channel 164.

Figure 6A:
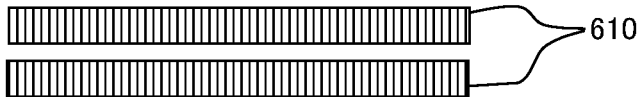
FIGS. 6A to 6D are views depicting a flow of another method of producing the ceramic base member 110.
Figure 6B:
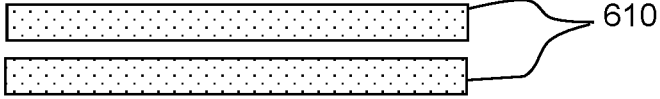

Note that the ceramic base member 110 can be formed also by the following method. As depicted in FIG. 6A, a binder is added to the granulated powder P of the aluminum nitride so as to perform the CIP (Cold Isostatic Press) molding followed by being processed to have a disc shape, thereby producing molded bodies (compacts) 610 of the aluminum nitride. Next, as depicted in FIG. 6B, a degreasing processing is performed for the molded bodies 610 so as to remove the binder.

Figure 6C:
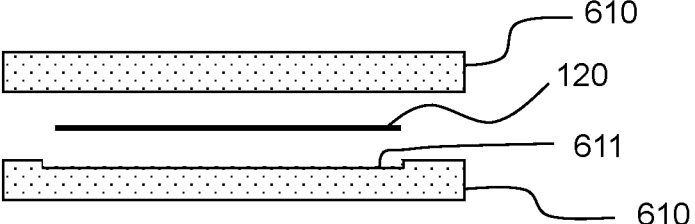
Figure 6D:
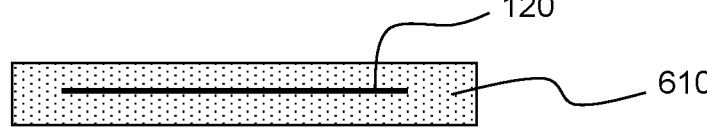

As depicted in FIG. 6C, a recessed part 611 for embedding the electrode 120 is formed in a degreased molded body 610 of the degreased molded bodies 610. The electrode 120 is arranged in the recessed part 611 formed in the molded body 610 of the molded bodies 610, and another molded body 610 is stacked on the molded body 610. It is also allowable to form the recessed part 611 in advance in the molded body 610. Next, as depicted in FIG. 6D, the molded bodies 610 which are stacked so as to sandwich the electrode 120 therebetween is subjected to the baking in a state that the stacked molded bodies 610 are pressed, thereby preparing a baked body. It is preferred that the pressure applied during the baking is not less than 1 MPa. Further, it is preferred that the basking is performed at a temperature which is not less than 1800° C. Since the steps after producing the baked boy are similar to the steps as described above, any explanation therefor will be omitted.

A grinding is performed with respect to the upper surface 111 of the ceramic base member 110 formed in such a manner, and a lapping processing (mirror surface polishing processing) is performed. Further, by performing a sand-blasting processing with respect to the upper surface 111, the plurality of projected parts 156 and the annular projected part 152 are formed in the upper surface 111. It is allowable to provide, on the lower surface 113 of the ceramic base member 110, the joining projected part 114 (see FIG. 4) which projects from the lower surface 113.

Next, an explanation will be given about a method of producing the shaft 130 and a method of joining the shaft 130 and the ceramic base member 110. First, granulated powder P of aluminum nitride to which several wt % of a binder has been added is molded at a hydrostatic pressure (approximately 1 MPa) so as to obtain a molded body (compact), and the obtained molded body is processed to have a predetermined shape. Note that the outer diameter of the shaft 130 is in a range of approximately 30 mm to approximately 100 mm. It is allowable to provide, on an end surface of the cylindrical part 131 of the shaft 130, the flange part 133 having the maximum outer diameter in the cylindrical part 131 (see FIG. 4). The length of the cylindrical part 131 may be, for example, to be in a range of 50 mm to 500 mm. In this situation, a through hole which becomes to be the second gas channel 168 is formed in the molded body.

Afterwards, the molded body is baked in an atmosphere of nitrogen. For example, the molded body is subjected to the baking at a temperature of 1900° C. for two hours so as to obtain a sintered body (sintered molded body). Then, after the baking, by processing the sintered body into a predetermined shape, the shaft 130 is formed. It is possible to fix the upper surface of the cylindrical part 131 and the lower surface 113 of the ceramic base member 110 by a diffusion bonding (joining) at a temperature not less than 1600° C. and under a uniaxial pressure of not less than 1 MPa. In this case, the surface roughness Ra of the lower surface 113 of the ceramic base member 110 is preferably not more than 0.4 more preferably not more than 0.2 Further, it is also possible to join the upper surface of the cylindrical part 131 and the lower surface 113 of the ceramic base member 110 by using a joining or bonding agent. As the joining agent, it is possible to use, for example, an AlN joining agent paste to which 10 wt % of $Y_2O_3$ has been added. For example, it is possible to join the upper surface of the cylindrical part 131 and the lower surface 113 of the ceramic base member 110 by coating the above-described AlN joining agent paste, at a thickness of 15 in the interface between the upper surface of the cylindrical part 131 and the lower surface 113 of the ceramic base member 110, and by performing heating therefor at a temperature of 1700° C. for one hour while applying a force of 5 kPa in a direction perpendicular to the upper surface 111 (the longitudinal direction 6 of the shaft 130). Alternatively, it is possible to join the upper surface of the cylindrical part 131 and the lower surface 113 of the ceramic base member 110 by screwing, blazing, etc.

Technical Effect of First Embodiment

In the first embodiment as described above, the substrate holder 100 is provided with the ceramic base member 110. The upper surface 111 of the ceramic base member 110 is provided with: the annular projected part 152 arranged at the outer peripheral part of the upper surface 111 and projected upward to be higher than the upper surface 111; and the plurality of projected parts 156 arranged on the inside with respect to the annular projected part 152 and projected upward to be higher than the upper surface 111. The shaft 130 having the cylindrical part 131 is joined to the lower surface 113 of the ceramic base member 110. Further, the circular area Sc which is coaxial with the ceramic base member 110 is provided on the center of the upper surface 111. The diameter φc of the circular area Sc is 70 mm and is not less than 0.4 times the inner diameter φ1 (45 mm) of the cylindrical part 131 of the shaft 130. In the first embodiment, the envelope surface P1 of the upper surfaces 156a of the projected parts 156, of the plurality of projected parts 156, arranged at the circular area Sc is the horizontal flat surface. In contrast, the envelope surface P2 of the upper surfaces 156a of the projected parts 156, of the plurality of projected parts 156, arranged at the outer area Sout is the convex surface which is bulged toward the center of the ceramic base member 110 (the curved surface which projects upward). In other words, the curvature of the envelope surface P1 is 0 (zero), and the curvature of the envelope surface P2 is a value which is not 0 (zero). Namely, the curvature of the envelope surface P1 and the curvature of the envelope surface P2 are mutually different.

Since the annular projected part 152 is provided on the outer peripheral part of the ceramic base member 110, it is possible to suppress any deformation of the outer edge part (outer peripheral part) of the wafer 10 in a case that the wafer 10 is attracted toward the upper surface of the ceramic base member 110 by suction. Further, the first envelope surface P1 of the upper surfaces 156a of the projected parts 156 is the flat (horizontal) surface in the circular area Sc of the upper surface 111 of the ceramic base member 110. Accordingly, in the case that the wafer 10 is attracted by suction toward the ceramic base member 110 by the vacuum suction, electrostatic suction, etc., the wafer 10 becomes stable at the central part of the wafer 10. With this, the central part of the wafer 10 is first attracted by suction to the ceramic base member 110, which in turn make the central part of the wafer 10 be flat. Afterwards, the attraction by suction progresses in the outer area Sout successively toward the outer side, and the wafer 10 is attracted by suction to the ceramic base member 110 so that the wafer 10 is along the envelope surface P2. Accordingly, in the case that the wafer 10 is attracted to the ceramic base member 110 by suction, it is possible to statically determinate the entire surface of the wafer 10 quickly. Further, since the central part of the wafer 10 is first attracted by suction to the ceramic base member 110 to thereby flatten the central part of the wafer 10, and then the attraction by suction progresses in the outer area Sout successively toward the outer side, there is no such a fear that the wafer 10 might be attracted by suction to the ceramic base member 110 in a state that the wafer 10 is inclined. This makes it possible to suppress any generation of a gap locally between the wafer 10 and the annular projected part 152. With this, it is possible to suppress any generation of a heat spot in the wafer 10, and to suppress any nonuniformity in temperature distribution of the wafer 10.

Second Embodiment

Next, a substrate holder 200 according to a second embodiment of the present disclosure will be explained below, with reference to FIG. 7. Note that a configuration which is similar to that of the substrate holder 100 of the first embodiment is denoted by a same reference numeral, and any explanation thereof will be omitted.

As depicted in FIG. 7, the substrate holder 200 is provided with a ceramic base member 110 which is similar to that of the substrate holder 100 according to the first embodiment. The above-described first gas channel 164 is formed in the inside of the ceramic base member 110, and an electrode 120 (see FIGS. 2 and 3) and an electrostatic attraction electrode 124 (see FIG. 2) are embedded in the inside of the ceramic base member 110. Further, a shaft 130 is joined to a lower surface 113 of the ceramic base member 110.

An annular projected part 152 and a plurality of projected parts 156 arranged in the inside of the annular projected part 152 are provided on an upper surface 111 of the ceramic base member 110. In a circular area Sc located at the center of the upper surface 111 of the ceramic base member 110, upper surfaces of projected parts 156, of the plurality of projected parts 156, are processed so that an envelope surface P1 of upper surfaces 156a of the projected parts 156 becomes to be a concave surface (a curved surface which projects downward). In an outer area Sout which is positioned at the outside of the circular area Sc, similarly to the first embodiment, upper surfaces of projected parts 156 of projected parts 156, of the plurality of projected parts 156, are processed so that an envelope surface P2 of upper surfaces 156a of the projected parts 156 becomes to be a curved surface which is along the upper surface 111 of the ceramic base member 110. In the second embodiment, a depth D1 of the recess of the envelope surface P1 is in a range of 3 μm and 10 μm, and a height H2 of the envelope surface P2 is 20 μm.

In the second embodiment, a diameter φc of the circular area Sc is 30 mmm and is not less than 0.4 times an inner diameter $\phi 1$ (45 mm) of a cylindrical part 131 of the shaft 130. As described above, in the second embodiment, the envelope surface P1 of the upper surfaces 156$a$ of the projected parts 156, of the plurality of projected parts 156, arranged at the circular area Sc is the concave surface which is recessed toward the center of the ceramic base member 110 (the curved surface which projects downward). In contrast, the envelope surface P2 of the upper surfaces 156$a$ of the projected parts 156, of the plurality of projected parts 156, arranged at the outer area Sout is the convex surface which is bulged toward the center of the ceramic base member 110 (the convex surface which projects upward). Namely, the curvature of the envelope surface P1 and the curvature of the envelope surface P2 are mutually different. As depicted in FIG. 7, the diameter $\phi c$ of the circular area Sc is greater than the inner diameter $\phi 1$ of the cylindrical part 131 of the shaft 130, and is smaller than a maximum outer diameter $\phi 2$ of the cylindrical part 131 of the shaft 130 ($\phi 1 < \phi c < \phi 2$). Note that similarly to the first embodiment, the diameter $\phi c$ of the circular area Sc can be made to be not less than 0.4 times the inner diameter $\phi 1$ of the cylindrical part 131 of the shaft 130. Further, the diameter $\phi c$ of the circular area Sc can be made to be not more than 1.5 times the maximum outer diameter $\phi 2$ of the cylindrical part 131 of the shaft 130.

Also in the second embodiment, since the annular projected part 152 is provided on the outer peripheral part of the ceramic base member 110, it is possible to suppress any deformation of the outer edge part (outer peripheral part) of the wafer 10 in a case that the wafer 10 is attracted toward the upper surface of the ceramic base member 110 by suction. Further, the first envelope surface P1 of the upper surfaces 156$a$ of the projected parts 156, of the plurality of projected parts 156, is the concave surface in the circular area Sc of the upper surface 111 of the ceramic base member 110. Accordingly, in the case that the wafer 10 is attracted toward the ceramic base member 110 by suction, the wafer 10 becomes stable at the central part of the wafer 10. With this, the central part of the wafer 10 is first attracted by suction to the ceramic base member 110, which in turn make the central part of the wafer 10 to be statistically determined. Afterwards, the attraction by suction progresses in the outer area Sout successively toward the outer side, and the wafer 10 is attracted by suction to the ceramic base member 110 so that the wafer 10 is along the envelope surface P2. In this case, it is possible to statically determinate the entire surface of the wafer 10 more quickly, as compared with a case that the wafer 10 is attracted to the ceramic base member 110 by suction and that the envelope surface P1 in the circular area Sc is a flat surface. Further, similarly to the first embodiment, since the central part of the wafer 10 is first attracted by suction to the ceramic base member 110 to statistically determinate the central part of the wafer 10, and then the attraction by suction progresses in the outer area Sout successively toward the outer side, there is no such a fear that the wafer 10 might be attracted by suction to the ceramic base member 110 in a state that the wafer 10 is inclined. This makes it possible to suppress any generation of a gap locally between the wafer 10 and the annular projected part 152. With this, it is possible to suppress any generation of a heat spot in the wafer 10, and to suppress any nonuniformity in temperature distribution of the wafer 10.

Third Embodiment

Next, a substrate holder 300 according to a third embodiment of the present disclosure will be explained below, with reference to FIG. 8.

Figure 8:
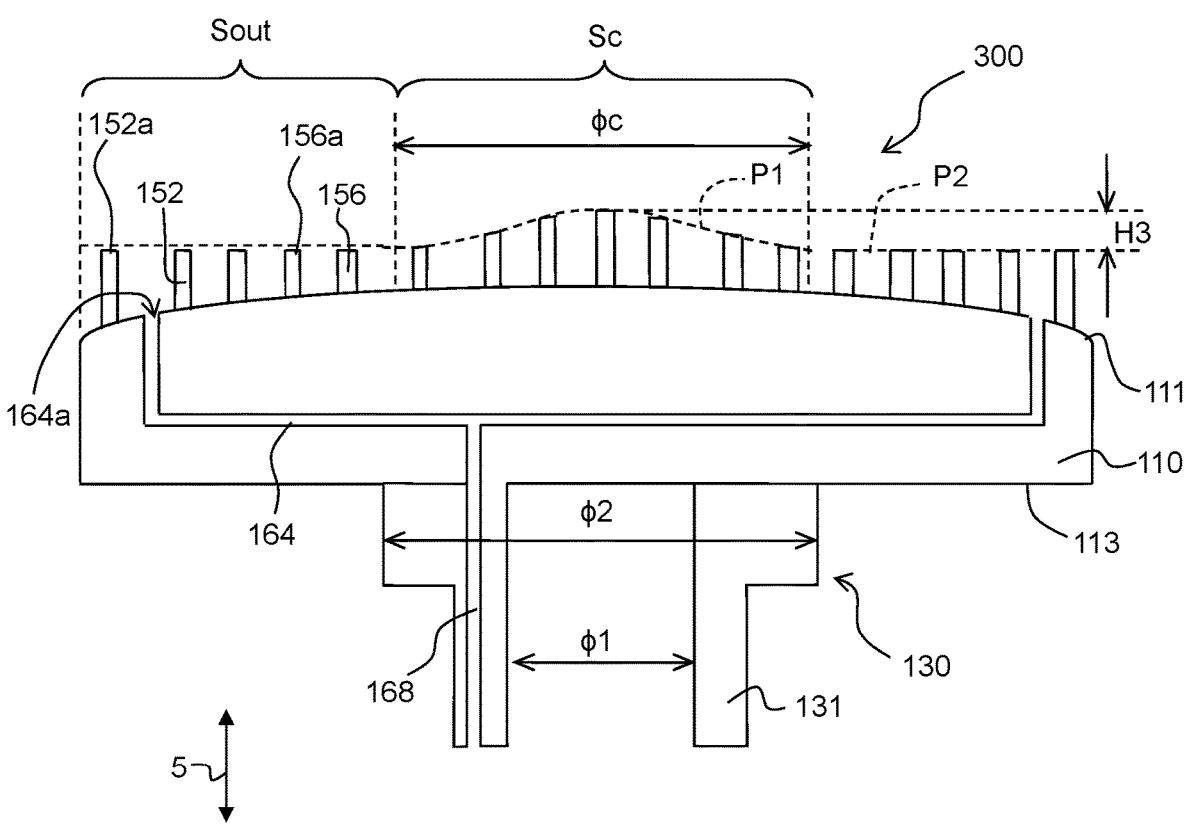
FIG. 8 is a view schematically explaining a substrate holder 300.

As depicted in FIG. 8, the substrate holder 300 is provided with a ceramic base member 110 which is similar to that of each of the substrate holder 100 according to the first embodiment and the substrate holder 200 according to the second embodiment. Similarly to the first and second embodiments, the above-described first gas channel 164 is formed in the inside of the ceramic base member 110, and an electrode 120 (see FIGS. 2 and 3) and an electrostatic attraction electrode 124 (see FIG. 2) are embedded in the inside of the ceramic base member 110. Further, a shaft 130 is joined to a lower surface 113 of the ceramic base member 110.

As depicted in FIG. 8, an annular projected part 152 and a plurality of projected parts 156 arranged in the inside of the annular projected part 152 are provided on an upper surface 111 of the ceramic base member 110. In a circular area Sc located at the center of the upper surface 111 of the ceramic base member 110, upper surfaces of projected parts 156, of the plurality of projected parts 156, are processed so that an envelope surface P1 of upper surfaces 156$a$ of the projected parts 156 becomes to be a convex surface (a curved surface which projects upward). In an outer area Sout which is positioned at the outside of the circular area Sc, upper surfaces of projected parts 156, of the plurality of projected parts 156, are processed so that an envelope surface P2 of upper surfaces 156$a$ of the projected parts 156 becomes to be a horizontal flat surface. In the third embodiment, a height H3 of a convex surface of the envelope surface P1 is 10 $\mu$m. Note that the height H3 of the convex surface of the envelope surface P1 is defined as a difference between a height of the highest part of the envelope surface P1 and a height of the lowest part of the envelope surface P1.

In the third embodiment, a diameter $\phi c$ of the circular area Sc is 90 mm and is not less than 0.4 times an inner diameter $\phi 1$ (45 mm) of a cylindrical part 131 of the shaft 130. As described above, in the third embodiment, the envelope surface P1 of the upper surfaces 156$a$ of the projected parts 156, of the plurality of projected parts 156, arranged at the circular area Sc, is the convex surface which is bulged toward the center of the ceramic base member 110 (the curved surface which projects upward). In contrast, the envelope surface P2 of the upper surfaces 156$a$ of the projected parts 156, of the plurality of projected parts 156, arranged at the outer area Sout, is the horizontal flat surface (a flat surface which is parallel to the lower surface 113 of the ceramic base member 110). Namely, the curvature of the envelope surface P1 and the curvature of the envelope surface P2 are mutually different. Note that the term "envelope surface" is a surface in which the difference in the height with respect to the plurality of the projected parts 156 is not more than 2 $\mu$m; in the third embodiment, the envelope surface P2 which is defined in such a manner is made to be a horizontal flat surface. As depicted in FIG. 8, the diameter $\phi c$ of the circular area Sc is greater than the inner diameter $\phi 1$ of the cylindrical part 131 of the shaft 130, and is smaller than a maximum outer diameter $\phi 2$ of the cylindrical part 131 of the shaft 130 ($\phi 1 < \phi c < \phi 2$). Note that similarly to the first embodiment, the diameter $\phi c$ of the circular area Sc can be made to be not less than 0.4 times the inner diameter $\phi 1$ of the cylindrical part 131 of the shaft 130. Further, the diameter $\phi c$ of the circular area Sc can be made to be not more than 1.5 times the maximum outer diameter $\phi 2$ of the cylindrical part 131 of the shaft 130.

Also in the third embodiment, since the annular projected part 152 is provided on the outer peripheral part of the ceramic base member 110, it is possible to suppress any deformation of the outer edge part (outer peripheral part) of the wafer 10 in a case that the wafer 10 is attracted toward the upper surface of the ceramic base member 110 by suction. Further, the first envelope surface P1 of the upper surfaces 156a of the projected parts 156, of the plurality of projected parts 156, is the convex surface in the circular area Sc of the upper surface 111 of the ceramic base member 110. Furthermore, the second envelope surface P2 of the upper surfaces 156a of the projected parts 156, of the plurality of projected parts 156, is the flat surface (horizontal surface) in the outer area Sout of the upper surface 111 of the ceramic base member 110. With this, it is possible to make the wafer 10 to uniformly be attracted to the ceramic base member 110, by suction, at the outer peripheral part of the wafer 10, as compared with a case that an envelope surface of the upper surfaces 156a of the plurality of projected parts 156 is a shape having a monotonous convex shape in the entirety of the upper surface of the wafer 10. In particular, even in a case that the wafer 10 is warped or bent such that a central area of the wafer 10 becomes to be higher as compared with the outer peripheral part of the wafer 10, it is possible to quickly attract the wafer 10 by suction to the ceramic base member 110 and to statically determinate the wafer 10. With this, even in a case that the wafer 10 is warped or bent as described above, there is no such a fear that the wafer 10 might be attracted by suction to the ceramic base member 110 in a state that the wafer 10 is inclined. This makes it possible to suppress any generation of a gap locally between the wafer 10 and the annular projected part 152. With this, it is possible to suppress any generation of a heat spot in the wafer 10, and to suppress any nonuniformity in temperature distribution of the wafer 10.

Fourth Embodiment

Next, a substrate holder 400 according to a fourth embodiment of the present disclosure will be explained below, with reference to FIG. 9.

Figure 9:
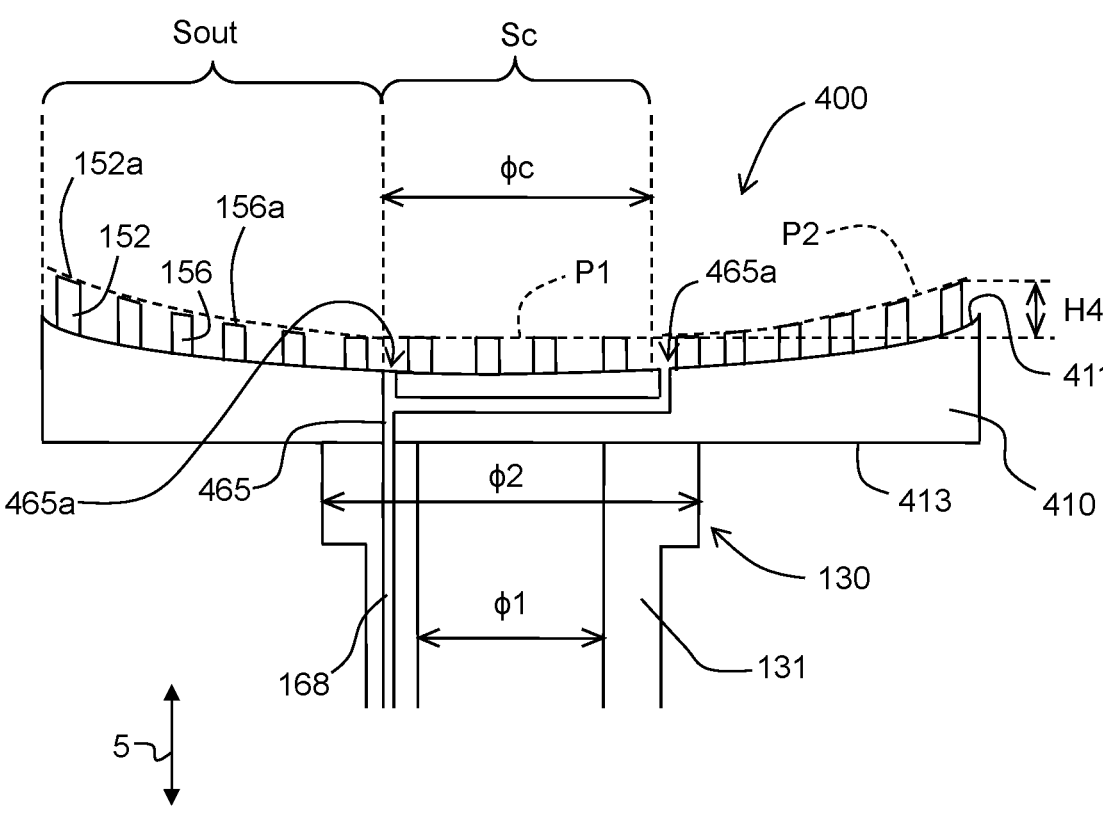
FIG. 9 is a view schematically explaining a substrate holder 400.

As depicted in FIG. 9, the substrate holder 400 is provided with a ceramic base member 410. Note that similarly to the first to third embodiments, an electrode 120 (see FIGS. 2 and 3) and an electrostatic attraction electrode 124 (see FIG. 2) are embedded in the inside of the ceramic base member 410. Further, a shaft 130 is joined to a lower surface 413 of the ceramic base member 110.

As depicted in FIG. 9, a second gas channel 465 is formed in the inside of the ceramic base member 400, instead of the above-described first gas channel 164. Four openings 465a of the second gas channel 465 are opened in the circular area Sc in an upper surface 411 of the ceramic base member 410. Note that in FIG. 9, only two pieces of the four openings 465a are illustrated. Note that although not depicted in the drawings, the four openings 465a are arranged, in the circular area Sc, in a circular form at equal intervals (at intervals of 90 degrees) therebetween. The second gas channel 465 extends downward from each of the four openings 465a and then extends in the horizontal direction to be joined, and extends further downward. A lower end of the second gas channel 465 is joined to an upper end of a gas channel 168 formed in the inside of the shaft 130.

As depicted in FIG. 9, the upper surface 411 of the ceramic base member 410 has a concave surface of which central part is recessed, as compared with an outer peripheral part thereof. In the fourth embodiment, the central part of the upper surface 411 of the ceramic base member 410 is made to be lower by 20 μm as compared with the outer peripheral part (outer edge part) of the upper surface 411.

As depicted in FIG. 9, an annular projected part 152 and a plurality of projected parts 156 arranged in the inside of the annular projected part 152 are provided on the upper surface 411 of the ceramic base member 410. In a circular area Sc located at the center of the upper surface 411 of the ceramic base member 110, upper surfaces of projected parts 156, of the plurality of projected parts 156, are processed so that an envelope surface P1 of upper surfaces 156a of the projected parts 156 becomes to be a flat (horizontal) surface. In an outer area Sout which is positioned at the outside of the circular area Sc, upper surfaces of projected parts 156, of the plurality of projected parts 156, are processed so that an envelope surface P2 of upper surfaces 156a of the projected parts 156 becomes to be a concave surface along the upper surface 411 of the ceramic base member 410. In the fourth embodiment, a height H4 of a concave surface of the envelope surface P2 is 20 μm. Note that the height H4 of the concave surface of the envelope surface P2 is defined as a difference between a height of the highest part of the envelope surface P2 and a height of the lowest part of the envelope surface P2.

In the fourth embodiment, a diameter φc of the circular area Sc is 55 mmm and is not less than 0.4 times an inner diameter φ1 (45 mm) of a cylindrical part 131 of the shaft 130. As described above, in the fourth embodiment, the envelope surface P1 of the upper surfaces 156a of the projected parts 156, of the plurality of projected parts 156, arranged at the circular area Sc is the horizontal flat surface. In contrast, the envelope surface P2 of the upper surfaces 156a of the projected parts 156, of the plurality of projected parts 156, arranged at the outer area Sout is the concave surface which projects downward. Namely, the curvature of the envelope surface P1 and the curvature of the envelope surface P2 are mutually different. As depicted in FIG. 9, the diameter φc of the circular area Sc is smaller than a maximum outer diameter φ2 of the cylindrical part 131 of the shaft 130 (φc<φ2). Note that similarly to the first embodiment, the diameter φc of the circular area Sc can be made to be not less than 0.4 times an inner diameter φ1 of the cylindrical part 131 of the shaft 130. Further, the diameter φc of the circular area Sc can be made to be not more than 1.5 times the maximum outer diameter φ2 of the cylindrical part 131 of the shaft 130.

Also in the fourth embodiment, since the annular projected part 152 is provided on the outer peripheral part of the ceramic base member 410, it is possible to suppress any deformation of the outer edge part (outer peripheral part) of the wafer 10 in a case that the wafer 10 is attracted toward the upper surface of the ceramic base member 410 by suction. Further, the first envelope surface P1 of the upper surfaces 156a of the projected parts 156, of the plurality of projected parts 156, is the flat (horizontal) surface in the circular area Sc of the upper surface 411 of the ceramic base member 410. Furthermore, the second envelope surface P2 of the upper surfaces 156a of the projected parts 156, of the plurality of projected parts 156, is the concave surface in the outer area Sout of the upper surface 411 of the ceramic base member 410. With this, it is possible to make the wafer 10 to uniformly be attracted to the ceramic base member 410, by suction, at the outer peripheral part of the water 10, as compared with a case that an envelope surface of the upper surfaces 156a of the plurality of projected parts 156 is a monotonous concave shape in the entirety of the upper surface 411 of the ceramic base member 410. In particular, even in a case that the wafer 10 is warped or bent such that a central area of the wafer 10 becomes to be lower as compared with the outer peripheral part of the wafer 10, it is possible to quickly attract the wafer 10 by suction to the ceramic base member 410 and to statically determinate the wafer 10. With this, even in a case that the wafer 10 is warped or bent as described above, there is no such a fear that the wafer 10 might be attracted by suction to the ceramic base member 410 in a state that the wafer 10 is inclined. This makes it possible to suppress any generation of a gap locally between the wafer 10 and the annular projected part 152. With this, it is possible to suppress any generation of a heat spot in the wafer 10, and to suppress any nonuniformity in temperature distribution of the wafer 10.

Fifth Embodiment

Next, a substrate holder 500 according to a fifth embodiment of the present disclosure will be explained below, with reference to FIG. 10.

Figure 10:
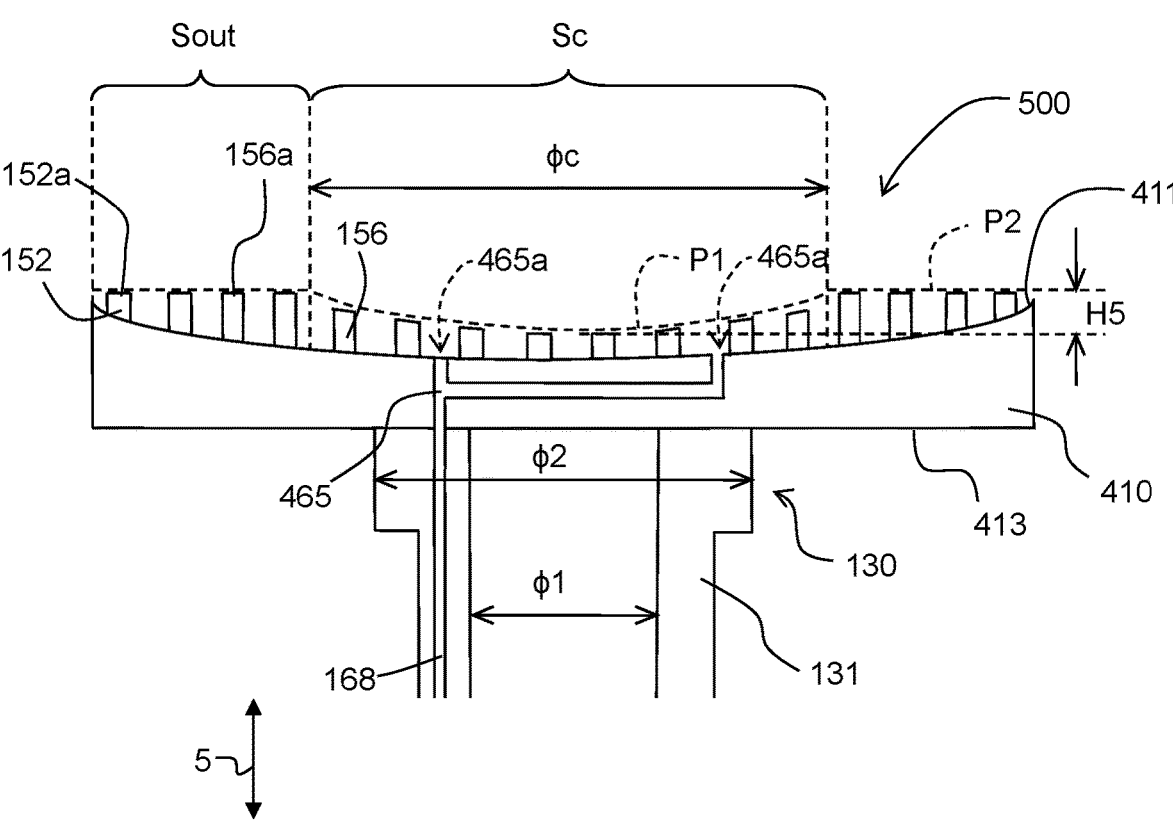
FIG. 10 is a view schematically explaining a substrate holder 500.

As depicted in FIG. 10, the substrate holder 500 is provided with a ceramic base member 410 which is similar to that of the substrate holder 400 of the fourth embodiment. Note that similarly to the fourth embodiment, the above-described second gas channel 465 is formed in the inside of the ceramic base member 410, and an electrode 120 (see FIGS. 2 and 3) and an electrostatic attraction electrode 124 (see FIG. 2) are embedded in the inside of the ceramic base member 410. Further, a shaft 130 is joined to a lower surface 413 of the ceramic base member 110.

As depicted in FIG. 10, an annular projected part 152 and a plurality of projected parts 156 arranged in the inside of the annular projected part 152 are provided on an upper surface 411 of the ceramic base member 410. In a circular area Sc located at the center of the upper surface 411 of the ceramic base member 110, upper surfaces of projected parts 156, of the plurality of projected parts 156, are processed so that an envelope surface P1 of upper surfaces 156a of the projected parts 156 becomes to be a concave surface which is recessed toward the center of the ceramic base member 410. In an outer area Sout which is positioned at the outside of the circular area Sc, upper surfaces of projected parts 156, of the plurality of projected parts 156, are processed so that an envelope surface P2 of upper surfaces 156a of the projected parts 156 becomes to be a horizontal flat surface (in the fifth embodiment, a flat surface parallel to the lower surface 113 of the ceramic base member 410. Note that the term "envelope surface" is a surface in which the difference in the height with respect to the plurality of the projected parts 156 is not more than 2 μm; in the fifth embodiment, the envelope surface P2 defined in such a manner becomes to be a horizontal flat surface. In the fifth embodiment, a height H5 of the concave surface of the envelope surface P1 is 20 μm. Note that the height H5 of the concave surface of the envelope surface P2 is defined as a difference between a height of the highest part of the envelope surface P2 and a height of the lowest part of the envelope surface P1.

In the fifth embodiment, a diameter $\phi c$ of the circular area Sc is 90 mmm and is not less than 0.4 times an inner diameter $\phi 1$ (45 mm) of a cylindrical part 131 of the shaft 130. As described above, in the fifth embodiment, the envelope surface P1 of the upper surfaces 156a of the projected parts 156, of the plurality of projected parts 156, arranged at the circular area Sc is the concave surface which project downward. In contrast, the envelope surface P2 of the upper surfaces 156a of the projected parts 156, of the plurality of projected parts 156, arranged at the outer area Sout is the horizontal flat surface. Namely, the curvature of the envelope surface P1 and the curvature of the envelope surface P2 are mutually different. As depicted in FIG. 10, the diameter $\phi c$ of the circular area Sc is greater than an inner diameter $\phi 1$ of the cylindrical part 131 of the shaft 130 and is greater than a maximum outer diameter $\phi 2$ of the cylindrical part 131 of the shaft 130 ($\phi 1 < \phi 2 < \phi c$). Note that similarly to the first embodiment, the diameter $\phi c$ of the circular area Sc can be made to be not less than 0.4 times the inner diameter $\phi 1$ of the cylindrical part 131 of the shaft 130. Further, the diameter $\phi c$ of the circular area Sc can be made to be not more than 1.5 times the maximum outer diameter $\phi 2$ of the cylindrical part 131 of the shaft 130.

Also in the fifth embodiment, since the annular projected part 152 is provided on the outer peripheral part of the ceramic base member 410, it is possible to suppress any deformation of the outer edge part (outer peripheral part) of the wafer 10 in a case that the wafer 10 is attracted toward the upper surface of the ceramic base member 410 by suction. Further, the first envelope surface P1 of the upper surfaces 156a of the projected parts 156, of the plurality of projected parts 156, is the concave surface in the circular area Sc of the upper surface 411 of the ceramic base member 410. Furthermore, the second envelope surface P2 of the upper surfaces 156a of the projected parts 156, of the plurality of projected parts 156, is the flat (horizontal) surface in the outer area Sout of the upper surface 411 of the ceramic base member 410. With this, it is possible to make the wafer 10 to uniformly be attracted to the ceramic base member 410, by suction, at the outer peripheral part of the water 10, as compared with a case that an envelope surface of the upper surfaces 156a of the plurality of projected parts 156 is a monotonous concave shape in the entirety of the upper surface 411 of the ceramic base member 410. In particular, even in a case that the wafer 10 is warped or bent such that a central area of the wafer 10 becomes to be lower as compared with the outer peripheral part of the wafer 10, it is possible to quickly attract, by suction, the outer peripheral surface of the wafer to the ceramic base member 410 and to statically determine the outer peripheral part of the wafer 10. With this, even in the case that the wafer 10 is warped as described above, there is no such a fear that the wafer 10 might be attracted by suction to the ceramic base member 410 in a state that the wafer 10 is inclined. This makes it possible to suppress any generation of a gap locally between the wafer 10 and the annular projected part 152. With this, it is possible to suppress any generation of a heat spot in the wafer 10, and to suppress any nonuniformity in temperature distribution of the wafer 10.

Modifications

The embodiments as described above are each merely an example, and may be changed as appropriate. For example, the shape and the size of each of the ceramic base member 110 and the shaft 130 are not limited to or restricted by those of the above-described embodiments, and may be changed as appropriate. Further, the size such as the height, width, etc., the shape, the magnitude of the surface roughness Ra of the upper surface of the annular projected part 152 may be changed as appropriate. Furthermore, the height of the plurality of projected parts 156, the shape of the upper surface 156a of the plurality of projected parts 156, the magnitude of the surface roughness Ra of the upper surface 156a may be changed as appropriate. Moreover, the diameter $\phi c$ of the circular area Sc can be changed as appropriately, provided that the diameter $\phi c$ is not less than 0.4 times the inner diameter $\phi 1$ of the cylindrical part 131 of the shaft 130.

Figure 11:
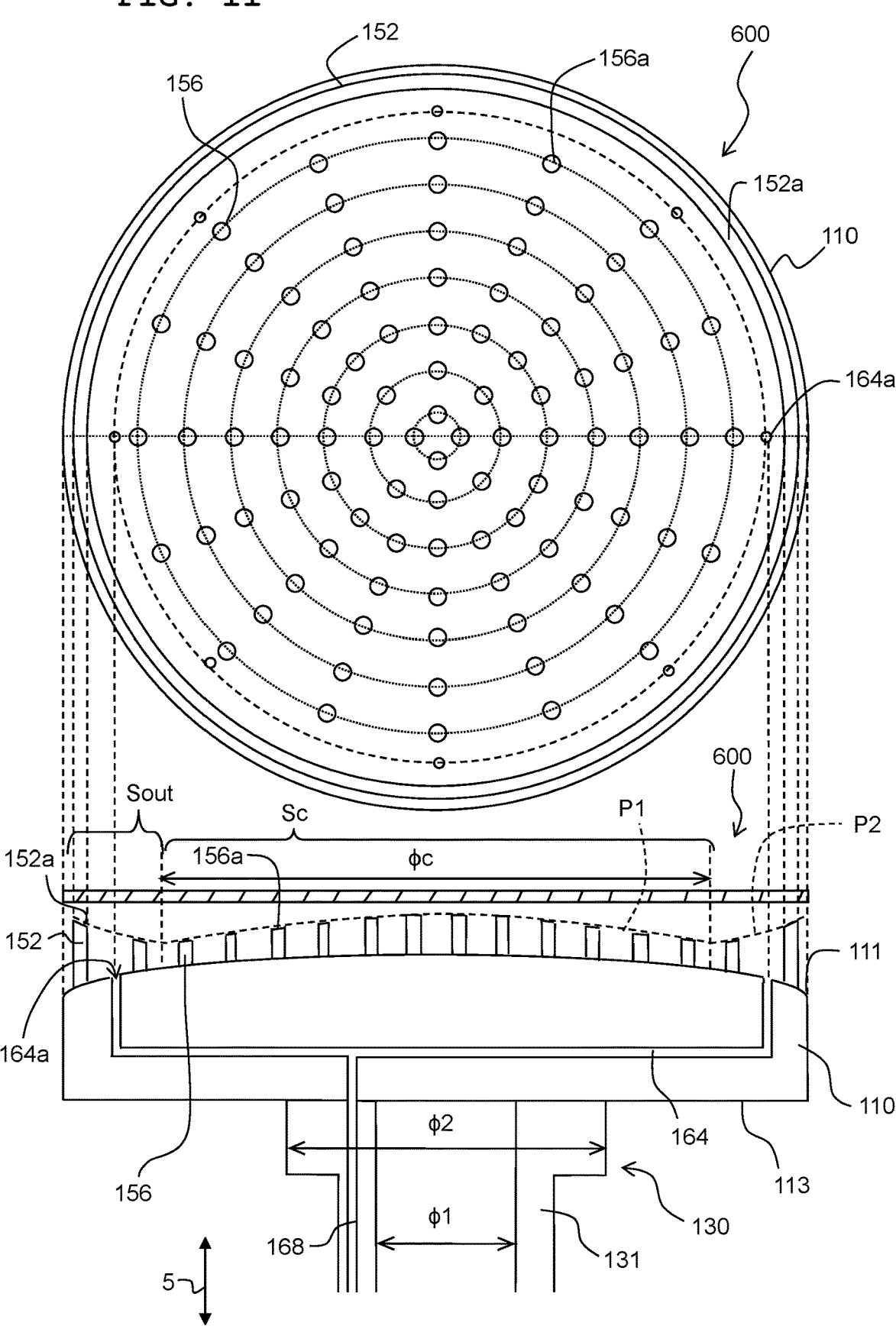
FIG. 11 is a view schematically explaining a substrate holder 600.

The curvature of the envelope surface P1 of the upper surfaces 156a of the projected parts 156 in the circular area Sc of the upper surface 111 of the ceramic base member 110 and the curvature of the envelope surface P2 of the upper surfaces 156a of the projected parts 156 in the outer area Sout of the upper surface 111 of the ceramic base member 110 are not limited to or restricted by the aspect in the each of the above-described embodiments. For example, as depicted in FIG. 11, it is allowable that the envelope surface P1 of the upper surfaces 156a of the projected parts 156, of the plurality of projected parts 156, which are in the circular area Sc is a curved surface which project upward, and that the envelope surface P2 of the upper surfaces 156a of the projected parts 156, of the plurality of projected parts 156, which are in the outer area Sout is a curved surface which project downward.

Also in this case, since the annular projected part 152 is provided on the outer peripheral part of the ceramic base member 110, it is possible to suppress any deformation of the outer edge part (outer peripheral part) of the wafer 10 in a case that the wafer 10 is attracted toward the upper surface of the ceramic base member 110 by suction. Further, the first envelope surface P1 of the upper surfaces 156a of the projected parts 156, of the plurality of projected parts 156, is the curved surface which project upwards in the circular area Sc of the upper surface 111 of the ceramic base member 110. With this, even in a case that the wafer 10 is warped or bent such that a central area of the wafer 10 becomes to be higher as compared with the outer peripheral part of the wafer 10, it is possible to quickly attract, by suction, the wafer 10 to the ceramic base member 110 and to statically determine the wafer 10. Further, the second envelope surface P2 of the upper surfaces 156a of the projected parts 156, of the plurality of projected parts 156, is the concave surface in the outer area Sout of the upper surface 111 of the ceramic base member 110. With this, the attraction property by suction in the outer area Sout of the wafer 10 becomes to be satisfactory, which in turn makes it possible to suppress any generation of a gap locally between the wafer 10 and the annular projected part 152. With this, it is possible to suppress any generation of a heat spot in the wafer 10, and to suppress any nonuniformity in temperature distribution of the wafer 10.

Further, it is not necessarily indispensable that the shape of the upper surface 156a of each of the plurality of projected parts 156 is circular, and the shape of the upper surface 156a of each of the plurality of projected parts 156 can be made to be an arbitrary shape. Note that also in such a case, it is preferred that the upper surface 156a of each of the plurality of projected parts 156 has an area which is of a similar extent to a circle of which diameter is in a range of 0.1 mm to 5 mm. Further, in the above-described explanation, although the plurality of projected parts 156 are arranged to be distributed coaxially, the present disclosure is not limited to or restricted by such an aspect. The position at which the plurality of projected parts 156 is arranged and/or the number (quantity) of the plurality of projected parts 156 is/are set appropriately, depending on the usage, action, function, etc., thereof. For example, the plurality of projected parts 156 may be arranged to be distributed in random positions. Also in such a case, the clearance among the plurality of projected parts 156 is preferably in a range of 1.5 mm to 30 mm.

In the above-described embodiments, although the upper surface 111 of the ceramic base member 110 is the convex curved surface or the concave curved surface, the present disclosure is not limited to such an aspect. For example, the upper surface 111 of the ceramic base member 110 may be a flat (horizontal) surface (a surface parallel to the lower surface 113 of the ceramic base member 110).

In the above-described embodiments, in the case that the upper surface 111 of the ceramic base member 110 is the convex curved surface, the first gas channel 164 provided on the inside of the ceramic base member 110 has the openings 164a in the outer area Sout; in the case that the upper surface 411 of the ceramic base member 410 is the concave curved surface, the second gas channel 465 provided on the inside of the ceramic base member 410 has the openings 465a in the circular area Sc. The present disclosure is not limited to such an aspect, and the shape of the gas channel formed in the inside of the ceramic base member can be appropriately changed. For example, the number (quantity), the arrangement, etc., of each of the openings 164a and 465a may be changed arbitrarily. Further, in the inside of each of the ceramic base members 110 and 410, it is also allowable that the first gas channel 164 having the openings 164a is formed in the outer area Sout and that the second gas channel 465 having the openings 465a is formed in the circular area Sc. In this case, the first gas channel 164 and the second gas channel 465 may be provided independently, or that the first gas channel 164 and the second gas channel 465 may communicate with each other.

Further, it is allowable that the gas channel 168 extending in the up-down direction 5 is not formed in the cylindrical part 131 of the shaft 130. For example, it is also allowable to provide a gas piping separately on the hollow area (the area provided with the feeding line 140) of the cylindrical part 131, instead of the gas channel 168.

In the above-described embodiments, although the molybdenum, the tungsten, or the alloy including the molybdenum and/or the tungsten is used as the electrode 120, the present disclosure is not limited to such an aspect. For example, it is also allowable to use a metal or an alloy different from the molybdenum and the tungsten. Further, although the electrode 120 is the heater electrode as the heating element, it is not necessarily indispensable that the electrode 120 is the heater electrode as the heating element; for example, the electrode 120 may be a high frequency electrode.

In the above-described embodiments, although the substrate holder 100 is provided with the electrode 120, the present disclosure is not limited to such an aspect; it is not necessarily indispensable that the substrate holder 100 is provided with the electrode 120. Further, even in a case that the substrate holder 100 is provided with the electrode 120, it is allowable that the electrode 120 is not embedded in the ceramic base member 110 of the substrate holder 100. For example, it is allowable that the electrode 120 is adhered to the lower surface 113 of the ceramic base member 110.

In the foregoing, although the explanation has been given by using the embodiments and the modifications thereof of the present disclosure, the technical scope of the present disclosure is not limited to the scope or range of the above-described description. It is apparent to a person skilled in the art that various changes or improvement can be made to the above-described embodiments and the modifications thereof. It is apparent, also from the description of the claims, to the person skilled in the art that an aspect obtained by adding such a change or improvement is also included in the technical scope of the present disclosure.

The order of executing of the respective processing in the production method indicated in the specification and in the drawings can be executed in an arbitrary order, unless the order is clearly described, and/or unless the output of a preceding processing is used in a succeeding processing. Even in a case that the explanation is given by using, for the sake of convenience, the terms such as "at first", "first", "next", "then", etc., it is not meant that it is necessarily indispensable that the respective processing are executed in this order.

What is claimed is:

1. A substrate holder comprising:
a ceramic base member including an upper surface and a lower surface which faces the upper surface in an up-down direction;
an electrode embedded in the ceramic base member or arranged in the lower surface of the ceramic base member; and
a shaft having a cylindrical part which has a cylindrical shape and which is joined to the lower surface of the ceramic base member, wherein
the ceramic base member includes:
    an annular projected part which is arranged in an outer peripheral part of the upper surface of the ceramic base member and which projects upward to be higher than the upper surface of the ceramic base member; and
    a plurality of projected parts which are arranged on an inner side, with respect to the annular projected part, of the upper surface of the ceramic base member, and which project upward to be higher than the upper surface of the ceramic base member,
a circular area which is coaxial with the ceramic base member and of which diameter is not less than 0.4 times an inner diameter of the cylindrical part is provided on a center in the upper surface of the ceramic base member,
the upper surface of the ceramic base member has a curved surface of which a central part projects upward more than the outer peripheral part, and
a first envelope surface which is an envelope surface of upper surfaces of projected parts, of the plurality of projected parts, arranged in the circular area is a flat surface, and a second envelope surface which is an envelope surface of upper surfaces of projected parts, of the plurality of projected parts, arranged at outside of the circular area is a curved surface, or
the first envelope surface is a curved surface and the second envelope surface is a flat surface.

2. The substrate holder according to claim 1, wherein the diameter of the circular area is not more than 1.5 times a maximum outer diameter of the cylindrical part.

3. The substrate holder according to claim 1, wherein the first envelope surface is the flat surface, and the second envelope surface is a curved surface which projects upward.

4. The substrate holder according to claim 1, wherein the first envelope surface is a curved surface which projects upward and the second envelope surface is the flat surface.

5. The substrate holder according to claim 1, wherein the first envelope surface is the flat surface and the second envelope surface is a curved surface which projects downward.

6. A substrate holder comprising:
a ceramic base member including an upper surface and a lower surface which faces the upper surface in an up-down direction;
an electrode embedded in the ceramic base member or arranged in the lower surface of the ceramic base member; and a shaft having a cylindrical part which has a cylindrical shape and which is joined to the lower surface of the ceramic base member, wherein
the ceramic base member includes:
    an annular projected part which is arranged in an outer peripheral part of the upper surface of the ceramic base member and which projects upward to be higher than the upper surface of the ceramic base member; and
    a plurality of projected parts which are arranged on an inner side, with respect to the annular projected part, of the upper surface of the ceramic base member, and which project upward to be higher than the upper surface of the ceramic base member,
a circular area which is coaxial with the ceramic base member and of which diameter is not less than 0.4 times an inner diameter of the cylindrical part is provided on a center in the upper surface of the ceramic base member, and
a first envelope surface which is an envelope surface of upper surfaces of projected parts, of the plurality of projected parts, arranged in the circular area is a flat surface, and a second envelope surface which is an envelope surface of upper surfaces of projected parts, of the plurality of projected parts, arranged at outside of the circular area is a curved surface, or
the first envelope surface is a curved surface having a first curvature and the second envelope surface is a flat surface or a curved surface having a second curvature which is different from the first curvature, and
the first envelope surface is a curved surface which projects downward and the second envelope surface is a curved surface which projects upward.

7. A substrate holder comprising:
a ceramic base member including an upper surface and a lower surface which faces the upper surface in an up-down direction;
an electrode embedded in the ceramic base member or arranged in the lower surface of the ceramic base member; and
a shaft having a cylindrical part which has a cylindrical shape and which is joined to the lower surface of the ceramic base member, wherein
the ceramic base member includes:
    an annular projected part which is arranged in an outer peripheral part of the upper surface of the ceramic base member and which projects upward to be higher than the upper surface of the ceramic base member; and
    a plurality of projected parts which are arranged on an inner side, with respect to the annular projected part, of the upper surface of the ceramic base member, and which project upward to be higher than the upper surface of the ceramic base member,
a circular area which is coaxial with the ceramic base member and of which diameter is not less than 0.4 times an inner diameter of the cylindrical part is provided on a center in the upper surface of the ceramic base member, and
a first envelope surface which is an envelope surface of upper surfaces of projected parts, of the plurality of projected parts, arranged in the circular area is a flat surface, and a second envelope surface which is an envelope surface of upper surfaces of projected parts, of the plurality of projected parts, arranged at outside of the circular area is a curved surface, or the first envelope surface is a curved surface having a first curvature and the second envelope surface is a flat surface or a curved surface having a second curvature which is different from the first curvature, and the first envelope surface is a curved surface which projects downward and the second envelope surface is the flat surface.

\* \* \* \* \*